United States Patent
Myoung et al.

(10) Patent No.: US 12,355,400 B2
(45) Date of Patent: Jul. 8, 2025

(54) SWITCHED CAPACITOR BASED HARMONIC REJECTION MIXER WITH THE CLOCKS HAVING TWO DIFFERENT DUTY CYCLES

(71) Applicant: NEWRACOM, Inc., Irvine, CA (US)

(72) Inventors: Seong-Sik Myoung, Cupertino, CA (US); Jonghoon Park, Irvine, CA (US); Chang Hun Song, Irvine, CA (US); Haejoon Yang, Gunpo-si (KR)

(73) Assignee: NEWRACOM, Inc., Irvine, CA (US)

( * ) Notice: Subject to any disclaimer, the term of this patent is extended or adjusted under 35 U.S.C. 154(b) by 152 days.

(21) Appl. No.: 18/550,640

(22) PCT Filed: Apr. 5, 2022

(86) PCT No.: PCT/US2022/071561
§ 371 (c)(1),
(2) Date: Sep. 14, 2023

(87) PCT Pub. No.: WO2022/221815
PCT Pub. Date: Oct. 20, 2022

(65) Prior Publication Data
US 2024/0186948 A1    Jun. 6, 2024

Related U.S. Application Data

(60) Provisional application No. 63/174,454, filed on Apr. 13, 2021.

(51) Int. Cl.
*H04B 1/04* (2006.01)
*H03D 7/12* (2006.01)
*H03K 19/20* (2006.01)

(52) U.S. Cl.
CPC ............ *H03D 7/12* (2013.01); *H03K 19/20* (2013.01); *H04B 1/0475* (2013.01)

(58) Field of Classification Search
None
See application file for complete search history.

(56) References Cited

U.S. PATENT DOCUMENTS

| | | |
|---|---|---|
| 2,982,822 A | 5/1961 | Bacon |
| 4,843,351 A | 6/1989 | Edwards et al. |
| 2008/0014896 A1 | 1/2008 | Zhuo et al. |

(Continued)

FOREIGN PATENT DOCUMENTS

| | | |
|---|---|---|
| KR | 10-2009-0023702 A | 3/2009 |
| KR | 10-2016-0060700 A | 5/2016 |

OTHER PUBLICATIONS

Office Action, KR App. No. 10-2023-7037367, Feb. 14, 2025, 22 pages (12 pages of English Translation and 10 pages of Original Document.

(Continued)

*Primary Examiner* — Patrick O Neill
(74) *Attorney, Agent, or Firm* — Nicholson, De Vos, Webseter & Elliott, LLP

(57) ABSTRACT

A harmonic rejection mixer that uses switched capacitors for amplitude control and uses two different duty cycle local oscillator (LO) signals for phase control for each harmonic. The harmonic rejection mixer uses 2-vector variable duty harmonic rejection. which allows for the harmonic rejection mixer to be less complex. consume less power, and/or use less components/space compared to conventional harmonic rejection mixers.

15 Claims, 11 Drawing Sheets

(56) References Cited

U.S. PATENT DOCUMENTS

| | | |
|---|---|---|
| 2009/0270062 A1 | 10/2009 | Mu et al. |
| 2011/0298521 A1 | 12/2011 | Ru et al. |
| 2012/0300887 A1 | 11/2012 | Seendripu et al. |
| 2014/0169237 A1 | 6/2014 | Furuta et al. |
| 2014/0378077 A1 | 12/2014 | Din et al. |
| 2015/0094004 A1 | 4/2015 | Vora et al. |
| 2016/0190987 A1 | 6/2016 | Bohannon et al. |
| 2019/0288722 A1 | 9/2019 | Asuri et al. |

OTHER PUBLICATIONS

IEEE 802.Nov. 2016, "Part 11: Wireless LAN Medium Access Control (MAC) and Physical Layer (PHY) Specifications," Standard, Institute of Electrical and Electronics Engineers, Inc. (IEEE), Dec. 7, 2016, 3534 pages.

IEEE Std 802.11ac-2013 "Part 11: Wireless LAN Medium Access Control (MAC) and Physical Layer (PHY) Specifications, Amendment 4: Enhancements for Very High Throughput for Operation in Bands below 6 GHz," IEEE Standard for Information technology—Telecommunications and information exchange between systems, Local and metropolitan area networks—Specific requirements, Dec. 18, 2013, 425 pages.

IEEE Std 802.11ah-2016, "Part 11: Wireless LAN Medium Access Control (MAC) and Physical Layer (PHY) Specifications, Amendment 2: Sub 1 GHz License Exempt Operation", IEEE Standard for Information technology—Telecommunications and information exchange between systems, Local and metropolitan area networks-Specific requirements, Dec. 7, 2016, 594 pages.

International Search Report and Written Opinion, PCT App. No. PCT/US2022/071561, Jul. 1, 2022, 8 pages.

Wikipedia, "Duty cycle," downloaded from https://en.wikipedia.org/wiki/Duty_cycle, last edited Dec. 18, 2020, pp. 1-4.

SWITCHED CAPACITOR BASED HARMONIC REJECTION MIXER WITH THE CLOCKS HAVING TWO DIFFERENT DUTY CYCLES

CROSS-REFERENCE TO RELATED APPLICATION

This application is a national stage of International Application No. PCT/US2022/071561, filed Apr. 5, 2022, which claims the benefit of U.S. Provisional Patent Application No. 63/174,454, filed Apr. 13, 2021, which is-are hereby incorporated by reference.

TECHNICAL FIELD

The present disclosure generally relates to harmonic rejection mixers, and more specifically, relates to a switched capacitor based harmonic rejection mixer using clocks having two different duty cycles.

BACKGROUND

For a transmitter, the up-conversion mixer is one of the most critical components affecting overall transmitter performance such as meeting the spurious emission mask requirement, as the up-conversion mixer is driven by the square wave LO (local oscillator) signal and the square wave LO signal consists of many high-order harmonics. The C-IMD3 (Third order Counter Inter-Modulation Distortion), which is caused by the third order harmonic of the mixer output and the third order nonlinearity of the backend blocks of the mixer such as the power amplifier, is one of the most critical analog impairments, as this impairment can cause spectrum regrowth that is far outside of the channel, and the spectrum emission requirement far outside of the channel is much tougher than the spectrum emission requirement near outside of the channel.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
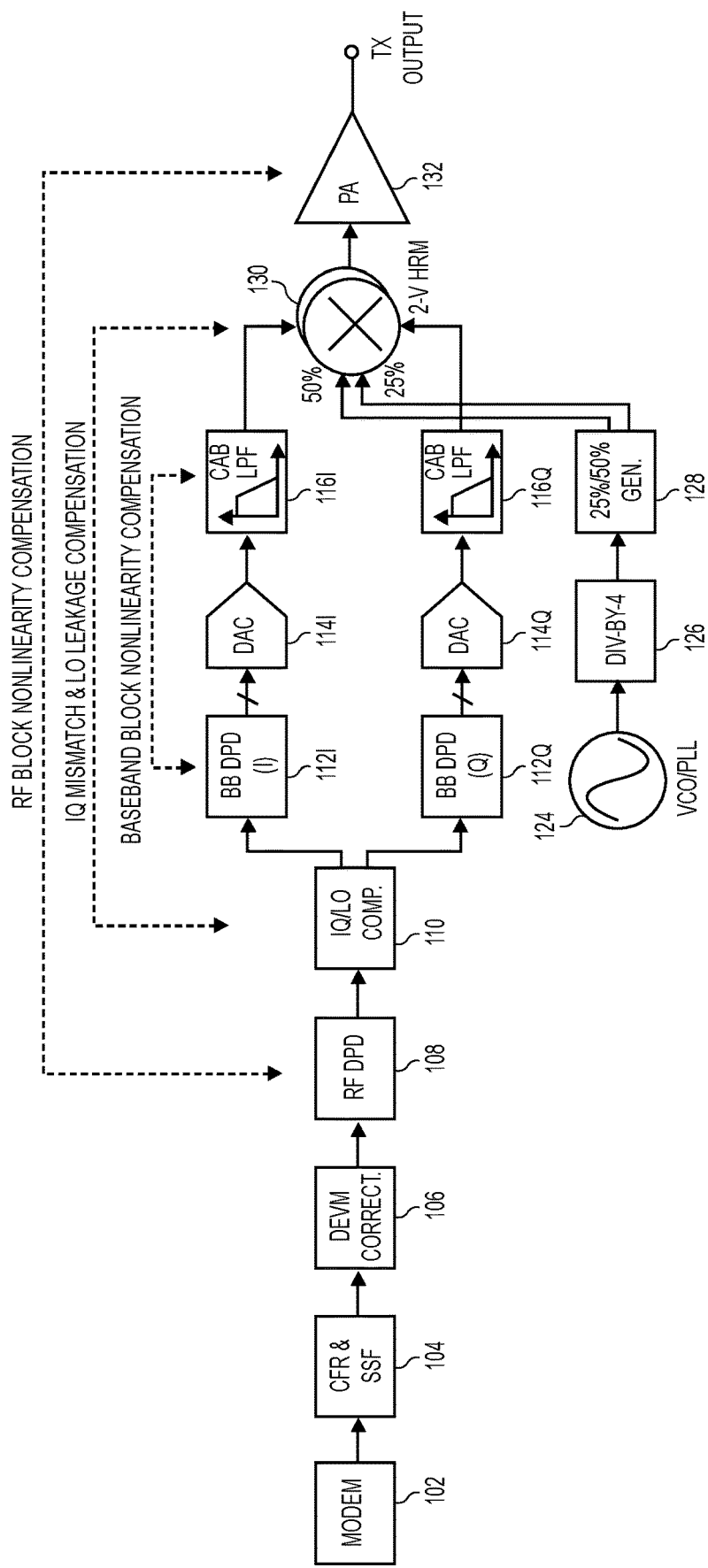
FIG. 1 is a diagram showing a portion of a transmitter chain, according to some embodiments.

The present disclosure generally relates to harmonic rejection mixers, and more specifically, relates to a switched capacitor based harmonic rejection mixer using clocks having two different duty cycles. An embodiment is a harmonic rejection mixer comprising a first switch to receive an I-path differential baseband input signal, wherein the first switch is to be controlled by a first I-path differential local oscillator (LO) signal having a 50 percent duty cycle, a second switch to receive the I-path differential baseband input signal, wherein the second switch is to be controlled by a second I-path differential LO signal having a 25 percent duty cycle, a third switch to receive a Q-path differential baseband input signal, wherein the third switch is to be controlled by a first Q-path differential LO signal having a 25 percent duty cycle, a fourth switch to receive the Q-path differential baseband input signal, wherein the fourth switch is to be controlled by a second Q-path differential LO signal having a 50 percent duty cycle, a first output capacitor coupled to the first switch, wherein the first output capacitor has a first capacitance, a second output capacitor coupled to the second switch and the third switch, wherein the second output capacitor has a second capacitance that is larger than the first capacitance by a multiple of a scaling factor, and a third output capacitor coupled to the fourth switch, wherein the third output capacitor has the first capacitance. The harmonic rejection mixer may use of 2-vector harmonic rejection, which allows for the harmonic rejection mixer to be less complex, consume less power, and/or use less components/space compared to conventional harmonic rejection mixers.

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 is a diagram showing a portion of a transmitter chain, according to some embodiments. As shown in the diagram, the transmitter chain (for a radio frequency (RF) transmitter) includes a modem module 102, a Crest Factor Reduction (CFR) and Spectrum Shaping Filter (SSF) module 104, a Dynamic Error Vector Magnitude (DEVM) correction module 106, a Radio Frequency section (RF) Digital Pre-Distortion (DPD) module 108, an IQ mismatch/Local Oscillator leakage (IQ/LO) compensation module 110, an I-path baseband (BB) DPD module 112I, a Q-path BB DPD module 112Q, an I-path Digital-to-Analog Converter (DAC) 114I, a Q-path DAC 114Q, an I-path Class-AB (CAB) Low-Pass Filter (LPF) 116I, a Q-path CAB LPF 116Q, a Voltage-Controlled Oscillator (VCO)/Phase-Locked Loop (PLL) module 124, a divide-by-4 circuit ("DIV-by-4") 126, a 25%/50% generator circuit 128, a mixer 130, and a power amplifier (PA) 132. In an embodiment, one or more components of the transmitter chain are implemented using purpose-built electronic circuitry, field-programable logic, processors executing computer programming instructions stored on non-transitory computer readable media, or combinations thereof, but embodiments are not limited thereto.

The modem module 102 may produce an output signal comprising a sequence of digital values. The digital values may represent complex numbers and accordingly each digital value may include a real value (I) and a complex value (Q) each expressed as a number represented by a plurality of bits. In an embodiment, the modem module 102 may be configured to produce signals according to a wireless standard. For example, the modem module 102 may be an Institute of Electrical and Electronics Engineers (IEEE) 802.11ah modem.

The CFR and SSF module 104 may process the output of the modem module 102 and provide the processed output to the DEVM correction module 106. The processing of the output of the modem module 102 by the CFR and SSF module 104 may provide proper spectrum shaping and Error Vector Magnitude (EVM), and may reduce the Peak-to-Average Power Ratio (PAPR) of the output.

The DEVM correction module 106 may operate to compensate for the variation in the instantaneous gain of the transmitter chain that may occur due to, for example, the transmitter chain experiencing a change in temperature after the transmitter chain begins transmitting. The DEVM correction module 106 may produce an output by applying a time-varying gain to a signal received from the modem module 102 or the CFR and SSF module 104.

The RF DPD module 108 may pre-distort the output of the DEVM correction module 106 to compensate for non-linearities in the PA 132, and in particular for variations in the gain of the PA 132 that depend on the magnitude of the signal input to the PA 132. The RF DPD module 108 may be configured to compensate for Amplitude-to-Amplitude modulation (AM2AM) nonlinearity, Amplitude-to-Phase modulation (AM2PM) nonlinearity, or both.

The IQ/LO compensation module 110 may modify the output of the RF DPD module 108 to compensate for any mismatch between the analog portion of the real (I) path and the analog portion of the imaginary (Q) path, for DC offset in the mixer 130, for leakage from the local oscillator (LO), or for combinations thereof. This operation may also be referred to as Carrier Suppression/Image Rejection (CS/IR) calibration. The IQ/LO compensation module 110 may receive input signals comprising complex-valued numbers, and may output a real component and an imaginary component each comprising respective real-valued numbers.

The real component of the output of the IQ/LO compensation module 110 may be provided to the I-path BB DPD module 112I, and the imaginary component of the output of the IQ/LO compensation module 110 may be provided to the Q-path BB DPD module 112Q.

The I-path BB DPD module 112I may compensate for nonlinearity caused by I-path baseband blocks such as the I-path LPF 116I and the mixer 130. The I-path BB DPD module 112I may compensate for only AM2AM distortion because the signals in the I-path are real-valued (i.e., not complex-valued) signals.

Similarly, the Q-path BB DPD module 112Q may compensate for nonlinearity caused by Q-path baseband blocks such as the Q-path LPF 116Q and the mixer 130. The Q-path BB DPD module 112Q may compensate for only AM2AM distortion because the signals in the Q-path are real-valued (i.e., not complex-valued) signals.

The I-path DAC 114I may convert the output of the I-path BB DPD module 112I from multi-bit digital values to corresponding analog values. The Q-path DAC 114Q may convert the output of the Q-path BB DPD module 112Q from multi-bit digital values to corresponding analog values. In an embodiment, the DACs 114I and 114Q have a sampling rate $f_s$ of 32 MHz but embodiments are not limited thereto.

The I-path CAB LPF 116I may filter the output of the I-path DAC 114I. Because the input impedance of passive mixers can be very low, the driving strength of the preceding block of the mixer has to be strong enough. As a result, the mixer driving stage (e.g., the LPF) typically consumes much power. The CAB LPF 116I (and CAB LPF 116Q) may be used to reduce power consumption without sacrificing the driving strength. In an embodiment, the I-path CAB LPF 116I has a selectable cut-off frequency (for example, the cut-off frequency may be configurable to be any one of a 1.5 MHz, 3 MHZ, and 6 MHz) but embodiments are not limited thereto.

Similarly, the Q-path CAB LPF 116Q may filter the output of the Q-path DAC 114Q. In an illustrative embodiment, the Q-path CAB LPF 116Q has a selectable cut-off frequency (for example, the cut-off frequency may be configurable to be any one of a 1.5 MHz, 3 MHZ, and 6 MHz) but embodiments are not limited thereto.

The VCO/PLL module 124 may produce an RF signal having a frequency according to a control voltage provided to the VCO/PLL module 124. In an embodiment, the VCO/PLL module 124 produces a signal having a frequency in the range of 3 to 3.8 GHZ, according to the control voltage, but embodiments are not limited thereto.

The divide-by-4 circuit 126 (which is a form of a frequency divider circuit) may produce a carrier signal by performing frequency division on the output signal of the VCO/PLL module 124 (to divide the output signal of the VCO/PLL module 124 by four). Accordingly, in an embodiment, when the VCO/PLL module 124 produces a signal having a frequency in the range of 3 to 3.8 GHz, the divide-by-4 circuit 126 may produce a carrier signal having a frequency of 750 MHZ to 950 MHz but embodiments are not limited thereto. In an embodiment, as will be described in additional detail herein, the divide-by-4 circuit 126 generates a 50% duty cycle 8-phase signal (for 0°, 45°, 90°, 135°, 180°, 225°, 270°, and 315° phases) based on performing divide by four on an input signal.

The 25%/50% generator circuit 128 may generate a 50% duty cycle LO signal and a 25% duty cycle LO signal based on the output of the divide-by-4 circuit 126. In an embodiment, as will be described in additional detail herein, the 25%/50% generator circuit 128 generates a 25% duty cycle LO signal based on the 50% duty cycle 8-phase signal generated by the divide-by-4 circuit 126 using a configuration of AND logic gates. The VCO/PLL module 124, the divide-by-4 circuit 126, and the 25%/50% generator circuit 128 may collectively form a LO signal generator.

The mixer 130 may combine the outputs of the I-path CAB LPF 116I, the Q-path CAB LPF 116Q, and the output of the 25%/50% generator circuit 128 (e.g., both the 50% duty cycle LO signal and the 25% duty cycle LO signal) to produce a modulated RF signal. In an embodiment, as will be described in additional detail herein, the mixer 130 is a switched capacitor based harmonic rejection mixer using clocks (also referred to herein as LO signals (e.g., LO signals having a 25% duty cycle and LO signals having a 50% duty cycle)) having different duty cycles that is able to effectively suppress/reduce third order harmonics. The mixer 130 may use switched capacitors for amplitude control and use two different duty cycle clocks for phase control for each harmonic. In an embodiment, unlike traditional harmonic rejection mixers that use three vectors or six vectors, the mixer 130 uses 2-vectors for harmonic rejection, where each vector represents a different duty cycle waveform. The use of 2-vector harmonic rejection may provide one or more advantages over conventional harmonic rejection solutions. For example, the use of 2-vector harmonic rejection may provide for a mixer that is less complex, consumes less power, and/or uses less components/space (e.g., compared to traditional harmonic rejection mixers that use three vectors and/or constant amplitude harmonic rejection mixers that use six vectors).

The PA 132 may amplify the modulated RF signal and provide it as a transmission output to an antenna or another RF transmission medium (such as coaxial cable, stripline, twist pair cable, or the like).

For RF nonlinearity caused by the RF blocks such as the PA 132, which may include AM2AM and AM2PM distortion, this RF nonlinearity may be compensated by an RF DPD circuit 108 or process. This impairment may also be caused by back-end blocks that perform I (In-phase) and Q (Quadrature-phase) merging, such as an up-conversion mixer 130.

For compensation of IQ mismatch and local oscillator (LO) leakage, an IQ/LO compensation circuit 110 or process may be used.

For BB (baseband) nonlinearity caused by the baseband blocks such as the LPF 116, which only has AM2AM distortion because it is caused by the front-end blocks before the I and Q merging, this impairment may be compensated by BB DPD circuits 112 or processes. As previously described, a BB DPD circuit 112 or process may be included for each of an I signal path and a Q signal path.

While a certain configuration of components is shown in the diagram to illustrate a particular example of a transmitter chain, it should be understood that other embodiments may use a different configuration (e.g., they may include additional components, not include certain components, and/or use a different arrangement of components).

Figure 2:
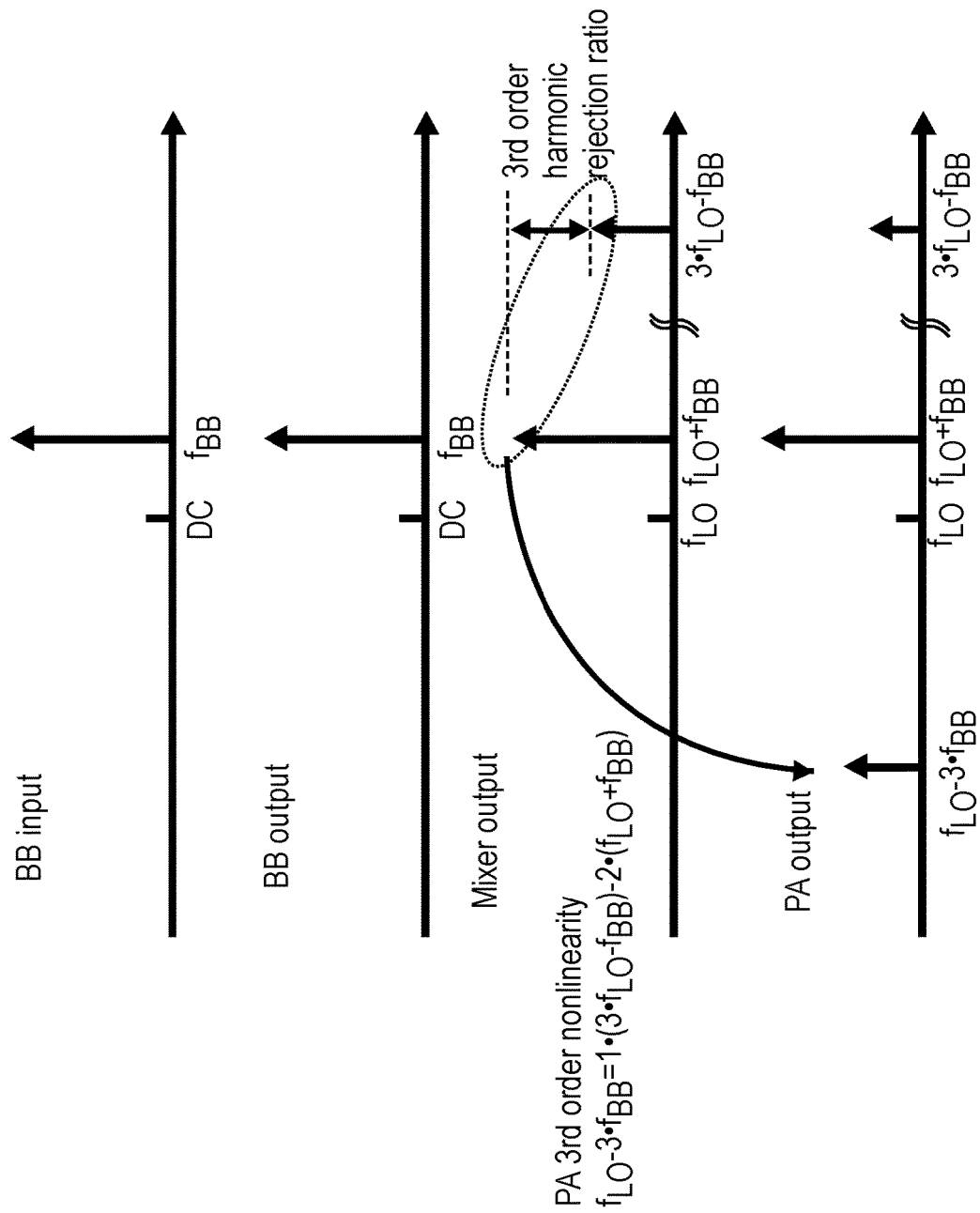
FIG. 2 is a diagram showing the spectrums of block outputs of a transmitter and the principle of the C-IMD3 degradation due to the third order harmonic of the mixer and the third order nonlinearity of the backend block of the mixer such as the power amplifier.

FIG. 2 is a diagram showing the spectrums of block outputs of a transmitter and the principle of the C-IMD3 (Third order Counter Inter-Modulation Distortion) degradation due to the third order harmonic of the mixer and the third order nonlinearity of the backend block of the mixer such as the power amplifier.

In the diagram, "BB input" represents the input signal spectrum of the analog baseband blocks, "BB output" represents the output signal spectrum of the analog baseband blocks, "Mixer output" represents the output signal spectrum of an up-conversion mixer with strong third order harmonic, "PA output" represents the output signal spectrum of the power amplifier or other backend blocks of the mixer with third order nonlinearity, $f_{BB}$ is the frequency of the baseband input signal tone, fro is the frequency of the local oscillator, "3rd order harmonic rejection ratio" is the ratio of the third order harmonic to the fundamental signal, the tone at $f_{LO}+f_{BB}$ is the fundamental signal of the up-converted signal, and the tone at $3 \cdot f_{LO}-f_{BB}$ is the third order harmonic of the up-converted signal.

If it is assumed that the mixer inputs ($x_I(t)$ and $x_Q(t)$) are a SSB (Single-Side Band) single-tone signal, the mixer input may be expressed as follows:

$$x_I(t) = \cos(2\pi f_{BB} t)$$

$$x_Q(t) = \sin(2\pi f_{BB} t)$$

If it is assumed that the LO signals ($s_I(t)$ and $s_Q(t)$) are square waves having 50% duty cycles, the LO signals and the mixer output (y(t)) may be expressed as follows:

$$s_I(t) = Rect50\%(t) = \sum_{n=1}^{\infty} \frac{1}{n \cdot \pi} \cos(2\pi \cdot n \cdot f_{LO} t)$$

$$= \frac{1}{\pi} \cos(2\pi f_{LO} t) - \frac{1}{3\pi} \cos(2\pi \cdot 3 \cdot f_{LO} t) +$$

$$\frac{1}{5\pi} \cos(2\pi \cdot 5 \cdot f_{LO} t) + \ldots$$

$$s_Q(t) = Rect50\%\left(t + \frac{T_0}{4}\right)$$

$$= \sum_{n=1}^{\infty} \frac{1}{n \cdot \pi} \cos\left(2\pi \cdot n \cdot f_{LO}\left(t + \frac{T_0}{4}\right)\right)$$

$$= \sum_{n=1}^{\infty} \frac{1}{n \cdot \pi} \cos\left(2\pi \cdot n \cdot f_{LO} t + n \frac{\pi}{2}\right)$$

$$= -\frac{1}{\pi} \sin(2\pi f_{LO} t) - \frac{1}{3\pi} \sin(2\pi \cdot 3 \cdot f_{LO} t) -$$

$$\frac{1}{5\pi} \sin(2\pi \cdot 5 \cdot f_{LO} t) + \ldots$$

$$y(t) = x_I(t) \cdot s_I(t) + x_Q(t) \cdot s_Q(t)$$

$$= \frac{1}{\pi}(\cos(2\pi f_{BB} t) \cdot \cos(2\pi f_{LO} t) - \sin(2\pi f_{BB} t) \cdot \sin(2\pi f_{LO} t) -$$

$$\frac{1}{3}(\cos(2\pi f_{BB} t) \cdot \cos(2\pi \cdot 3 \cdot f_{LO} t) +$$

$$\sin(2\pi f_{BB} t) \cdot \sin(2\pi \cdot 3 \cdot f_{LO} t)) +$$

$$\frac{1}{5}(\cos(2\pi f_{BB} t) \cdot \cos(2\pi \cdot 5 \cdot f_{LO} t) -$$

$$\sin(2\pi f_{BB} t) \cdot \sin(2\pi \cdot 5 \cdot f_{LO} t)) + \ldots )$$

$$= \frac{1}{\pi}\left(\cos(2\pi (f_{LO} + f_{BB})t) - \frac{1}{3}\cos(2\pi (3 \cdot f_{LO} - f_{BB})t) +$$

$$\frac{1}{5}\cos(2\pi (5 \cdot f_{LO} + f_{BB})t) + \ldots \right)$$

In the above equations, $T_0$ is the period of the square waveform and $T_0 = 1/f_{LO}$. Also, $f_{LO}$ in the above equations, $s_I(t)$ and $s_Q(t)$ have a 90 degree ($T_0/4$) phase difference.

As a result, the mixer output (y(t)) has a strong third order harmonic at the frequency of ($3 \cdot f_{LO} - f_{BB}$), and the third order harmonic rejection ratio or the ratio of the third order harmonic to the fundamental tone at the frequency of ($f_{LO}+f_{BB}$) is ⅓ or −9.5 dB.

This strong third order harmonic of the mixer output is inter-modulated with the fundamental tone due to the third order nonlinearity of the backend blocks such as the power amplifier, and the inter-modulated signal due to the third order nonlinearity (z(t)) may be expressed as follows:

$$z(t) = c_3 \cdot y(t) \cdot y(t) \cdot y(t)*$$

In the above equation, $c_3$ is the proportional constant representing the degree of the nonlinearity.

One of the mixing products of the above equation is $f_{LO} - 3 \cdot f_{BB} = 1 \cdot (3 \cdot f_{LO} - f_{BB}) - 2 \cdot (f_{LO} + f_{BB})$, and this signal is the C-IMD3 distortion.

The C-IMD3 signal is placed at the frequency of ($f_{LO} - 2 \cdot f_{BB}$), and the C-IMD3 of the single-side band signals such as 802.11ah CBW1 (1 MHz channel bandwidth) or small number of RB (Resource Block) LTE (Long Term Evolution) is placed at the frequency band requiring stringent emission limit.

Figure 3:
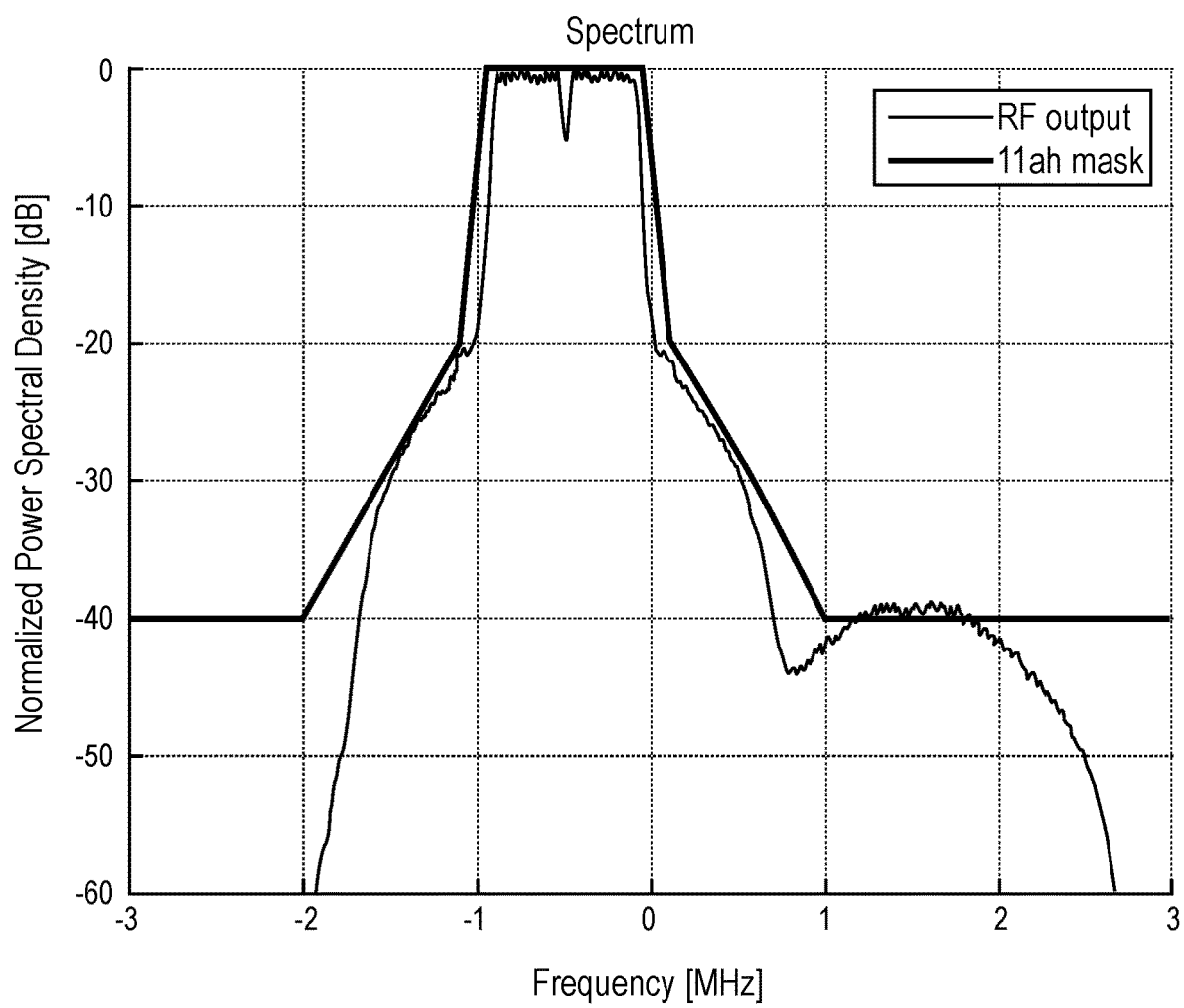
FIG. 3 is a diagram showing the spectrum of 802.11ah CBW1 with the C-IMD3 distortion.

FIG. 3 is a diagram showing the spectrum of 802.11ah CBW1 with the C-IMD3 distortion. In the diagram, the x-axis of the graph represents frequency (in MHz) and the y-axis represents normalized power spectral density (in dB). In the example shown in the diagram, the channel band is from −1 MHz to 0 MHz, and the C-IMD3 signal is placed from 0 MHz to +3 MHz. However, 802.11ah CBW1 spectrum emission mask requires −40 dBr emission limit outside of +/−1.5 MHz from the center frequency of the CBW1, which is −500kHz in this example, and this emission limit is significantly more stringent than the emission limit on other frequency ranges.

As such, the C-IMD3 often becomes the bottleneck for the transmitter linearity for the maximum output power. To improve the C-IMD3, the power amplifier has to be more linearized or the third order harmonic of the mixer output has to be suppressed. Since the power amplifier linearization on the analog domain typically requires more power consumption, embodiments use a new third order harmonic suppression technique to improve the C-IMD3 and transmitter chain linearity. An embodiment is a harmonic rejection mixer for a transmitter with switched capacitor for amplitude control that uses two different duty cycle clocks for phase control for each harmonic.

Figure 4:
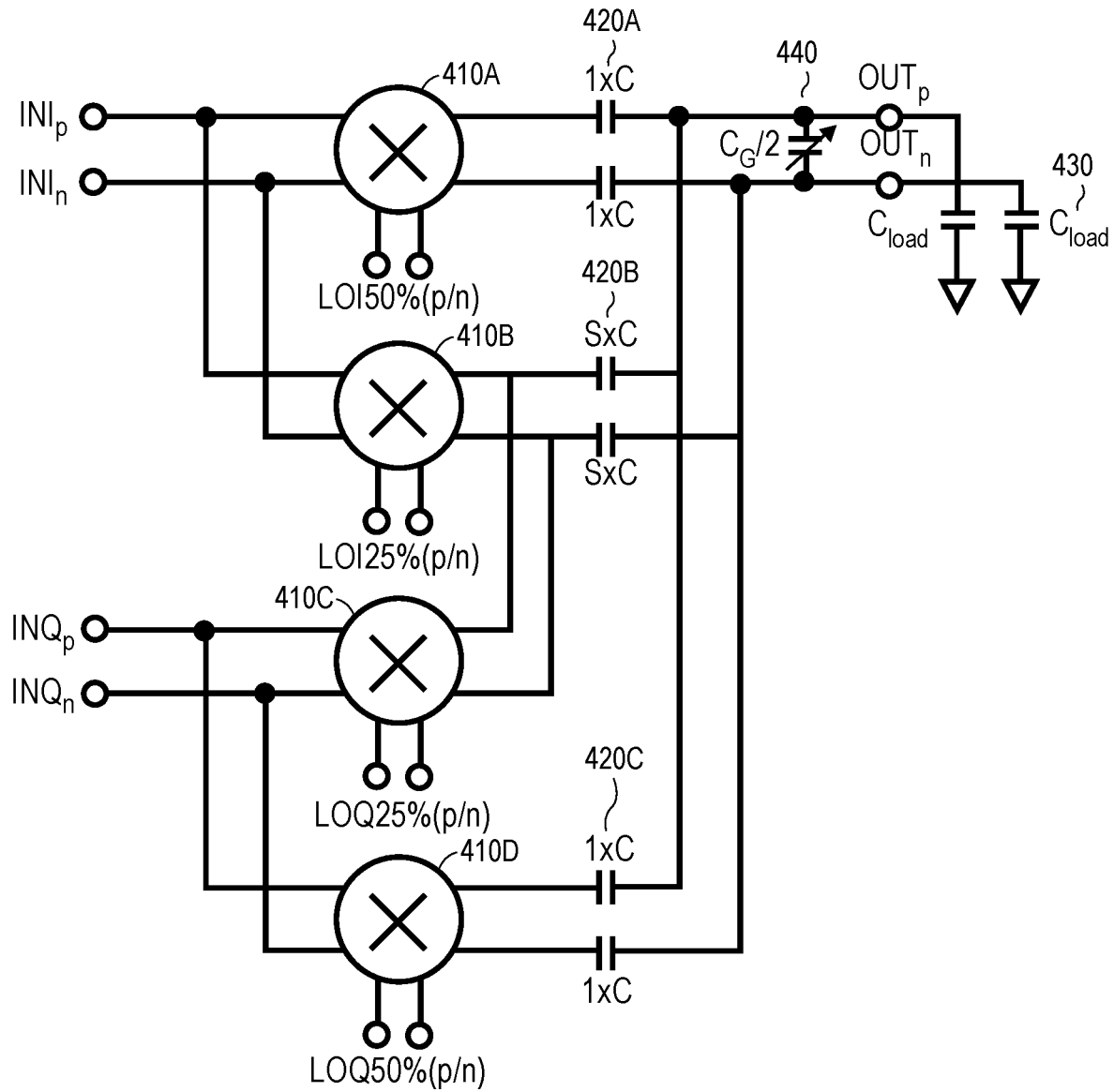
FIG. 4 is a diagram showing a circuit of an up-conversion harmonic rejection mixer, according to some embodiments.

FIG. 4 is a diagram showing a circuit of an up-conversion harmonic rejection mixer, according to some embodiments.

As shown in the diagram, the circuit includes switch cells 410A, 410B, 410C, and 410D and output capacitors (capacitor pairs) 420A, 420B, and 420C. In the diagram, $INI_p$ and $INI_n$ are I-path (in-phase) differential baseband input signals, $INQ_p$ and $INQ_n$ are Q-path (quadrature phase) differential baseband input signals, LOI50%(p/n) is an I-path differential LO signal having a 50% duty cycle, LOI25%(p/n) is an I-path differential LO signal having a 25% duty cycle, LOQ50%(p/n) is a Q-path differential LO signal having 50% duty cycle, LOQ25%(p/n) is a Q-path differential LO signal having a 25% duty cycle, "1×C" is the capacitance of the output capacitors 420A and 420C that are controlled by the 50% duty cycle signals, "S×C" is the capacitance of the output capacitor 420B that is controlled by the 25% duty cycle signals (where S is a scaling factor so that the capacitance of this capacitor is S times larger than "1×C"), and $OUT_p$ and $OUT_n$ are the differential outputs of the mixer. In an embodiment, the scaling factor (S) is 1.4 or √2.

Figure 5:
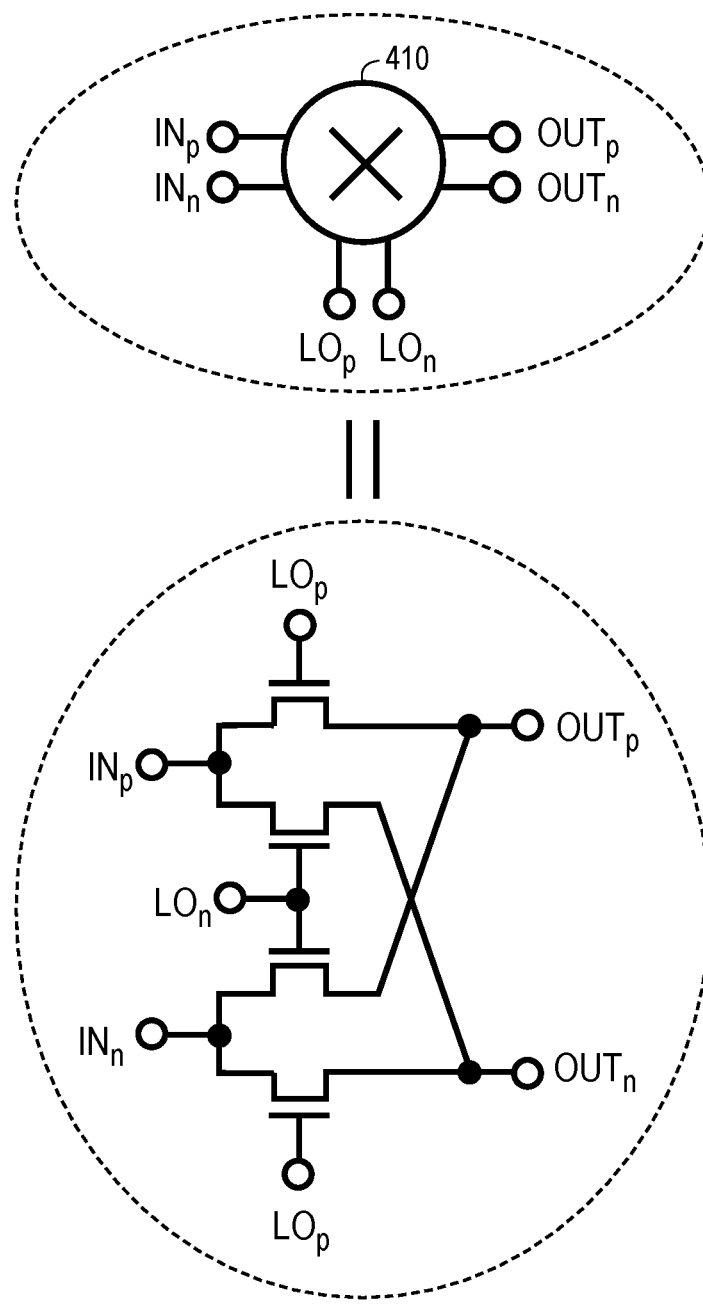
FIG. 5 is a diagram showing a schematic of the unit switch cell, according to some embodiments.

As shown in the diagram, switch cell 410A receives $INI_p$ and $INI_n$ as inputs. Switch cell 410A is coupled to output capacitor 420A. Also, switch cell 410B receives $INI_p$ and $INI_n$ as inputs. Switch cell 410B is coupled to output capacitor 420B. Also, switch cell 410C receives $INQ_p$ and $INQ_n$ as inputs. Switch cell 410C is coupled to output capacitor 420B. Also, switch cell 410D receives $INQ_p$ and $INQ_n$ as inputs. Switch cell 410D is coupled to output capacitor 420C. In an embodiment, each switch cell 410 may have a configuration as shown in FIG. 5 or similar configuration.

In an embodiment, as shown in the diagram, the differential outputs of the harmonic rejection mixer ($OUT_p$ and $OUT_n$) are provided as inputs to a load capacitor 430 (a capacitor pair). In an embodiment, the load capacitor 430 is the equivalent input capacitor of the mixer load circuit such as the PA 132 shown in FIG. 1. The load capacitor 430 may have a capacitance of $C_{load}$, which may be the load capacitance of the mixer or the equivalent input capacitance of the mixer load circuit.

In an embodiment, as shown in the diagram, the circuit also includes a gain control capacitor 440 to provide conversion gain control. In an embodiment, as shown in the diagram, the gain control capacitor has a capacitance of $C_g$ and the capacitor dividing ratio is 2. Conversion gain control may be achieved by adjusting $C_g$ and the capacitor dividing ratio. If the capacitance of the gain control capacitor $C_g$ is increased, the output voltage level is decreased because of the increased loss on the output capacitor consisting of the voltage divider with the load capacitance of $C_{load}$ and gain control capacitor $C_g$. The increased $C_g$ and lower gain may cause lower input resistance and LPF linearity degradation but the degradation may be acceptable with the proper LPF gain control.

Figure 6:
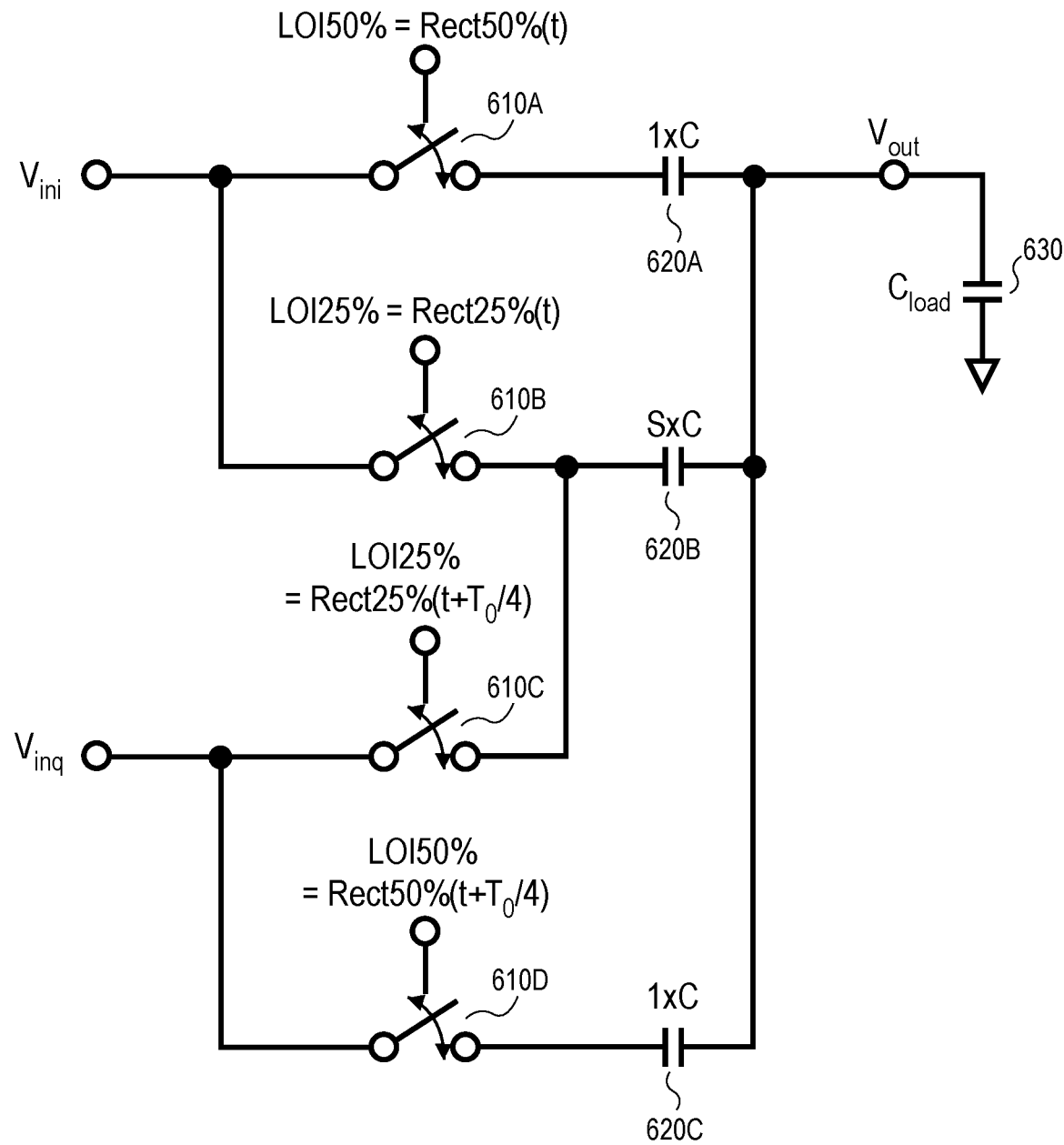
FIG. 6 is a diagram showing the single-ended equivalent circuit of the harmonic rejection mixer with the ideal switches replacing the mixer switch cells, according to some embodiments.

FIG. 6 is a diagram showing the single-ended equivalent circuit of the harmonic rejection mixer with the ideal switches replacing the mixer switch cells, according to some embodiments. As shown in the diagram, the circuit includes switches 610A, 610B, 610C, and 610D and output capacitors 620A, 620B, and 620C. Output capacitors 620A and 620C have a capacitance of "1×C" while output capacitor 620B has a capacitance of "S×C", where S is a scaling factor. Switches 610A and 610B receive an I-path baseband input signal $V_{ini}$. Switches 610C and 610D receive a baseband input signal $V_{inq}$. Switch 610A is controlled by an I-path LO signal having a 50 percent duty cycle (LOI50%), which may be a rectangular waveform signal (Rect50%(t)). Switch 610B is controlled by an I-path LO signal having a 25 percent duty cycle (LOI25%), which may be a rectangular waveform signal (Rect25%(t)). Switch 610C is controlled by a Q-path LO signal having a 25 percent duty cycle (LOQ25%), which may be a phase-shifted rectangular waveform signal (Rect25%(t+$T_0$/4)). Switch 610D is controlled by a Q-path LO signal having a 50 percent duty cycle (LOQ50%), which may be a phase-shifted rectangular waveform signal (Rect50%(t+$T_0$/4)). In the diagram, $V_{out}$ is the output of the mixer. In an embodiment, the output of the mixer is provided as an input to a load capacitor 630. The load capacitor may have a capacitance $C_{load}$, which may be the load capacitance of the mixer or the equivalent input capacitor of the mixer load block.

Figure 7:
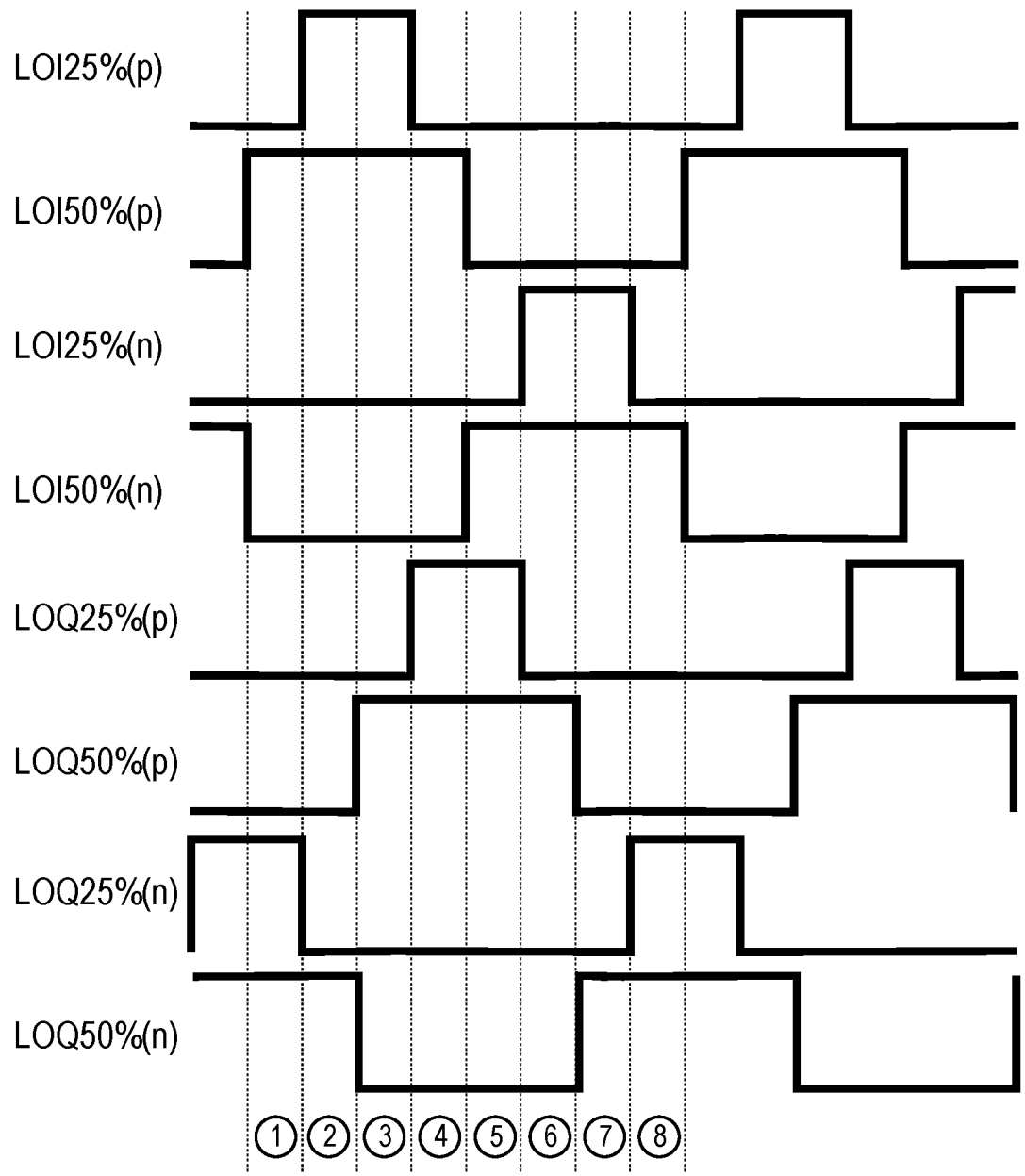
FIG. 7 is a diagram showing the waveforms of the clocks controlling the harmonic rejection mixer, according to some embodiments.

FIG. 7 is a diagram showing the waveforms of the clocks controlling the harmonic rejection mixer, according to some embodiments. In an embodiment, as shown in the diagram, one period of the clocks controlling the switches of the harmonic rejection mixer consists of 8-phase (phases 1-8). The states of the switches of the harmonic rejection mixer (e.g., which ones are activated and which ones are not) may be different for each phase. As a result, as will be further described below, the output voltage of the mixer may change depending on the phase.

Figure 8:
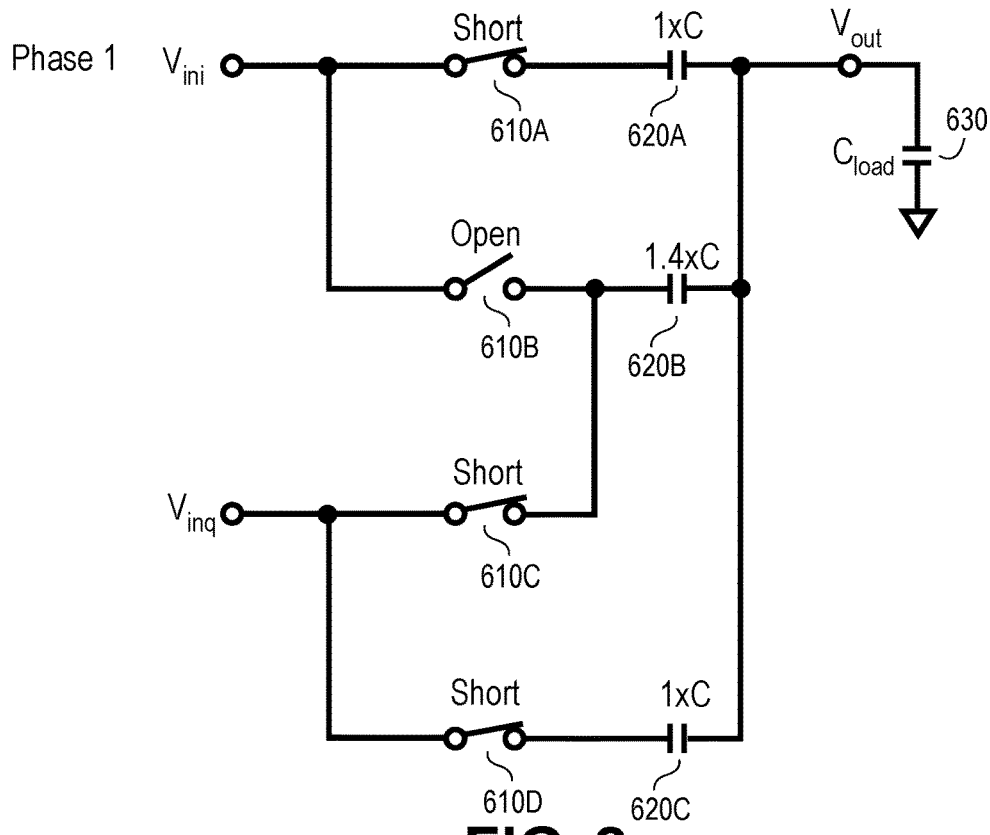
FIG. 8 is a diagram showing the state of the switches during the first phase (phase 1), according to some embodiments.

FIG. 8 is a diagram showing the state of the switches during the first phase (phase 1), according to some embodiments. For purposes of illustration, a scaling factor of 1.4 is used below to describe some embodiments. It should be understood that other embodiments may use a different scaling factor (e.g., √2 or an approximate thereof).

As shown in the diagram, during the first phase, the "1×C" output capacitors 620A and 620C are connected to the I-path and Q-path inputs, respectively, and the "1.4×C" output capacitor 620B is connected to the Q-path input (but not the I-path input). As such, the total capacitance connected to the Q-path input and the output node is 2.4×C. If it is assumed that the inputs are connected to the voltage source, the output voltage ($V_{out}$) during the first phase may be calculated as follows:

$$V_{out}|_{phase\,(1)} = \frac{1 \times C}{1 \times C + 1.4 \times C + 1 \times C + C_{load}} \cdot V_{ini} +$$

$$\frac{1.4 \times C + 1 \times C}{1 \times C + 1.4 \times C + 1 \times C + C_{load}} \cdot V_{inq} = A \cdot (V_{ini} + 2.4 \cdot V_{inq}),$$

$$\text{where } A = \frac{C}{3.4 \cdot C + C_{load}}.$$

Figure 9:
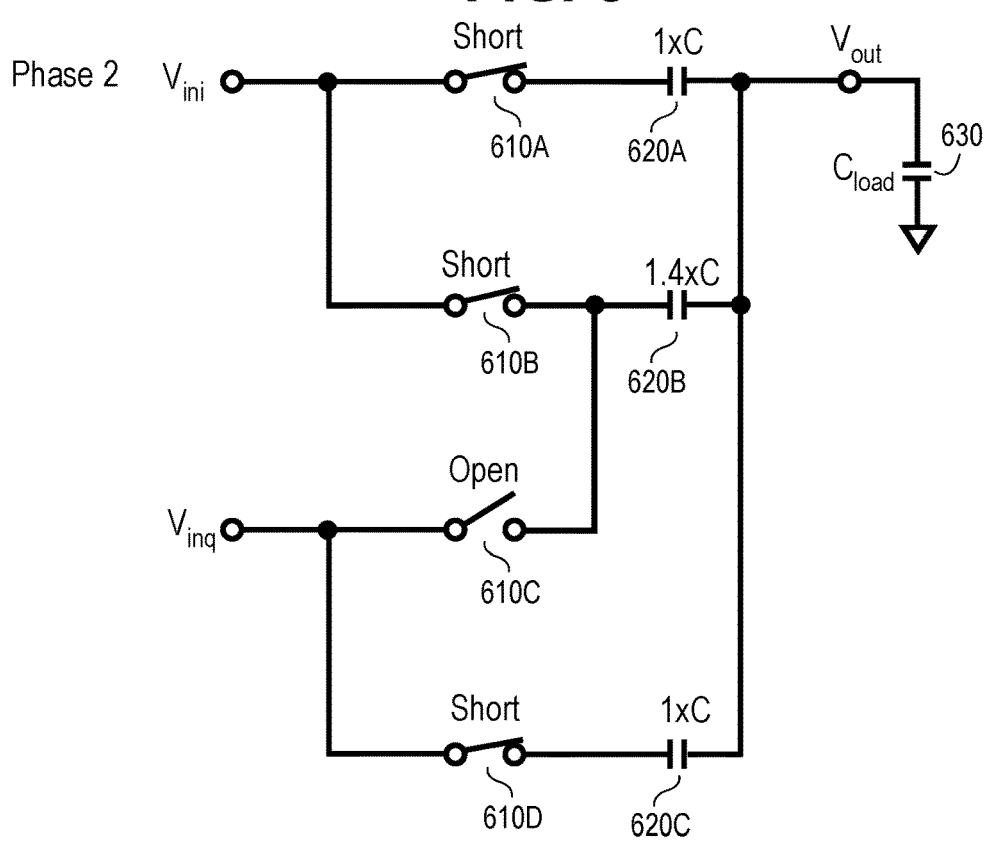
FIG. 9 is a diagram showing the state of the switches during the second phase (phase 2), according to some embodiments.

FIG. 9 is a diagram showing the state of the switches during the second phase (phase 2), according to some embodiments.

During the second phase, the "1×C" output capacitor 620A and the "1.4×C" output capacitor 620B are connected to the I-path input, and thus the output voltage during the second phase may be calculated as follows:

$$V_{out}|_{phase\,(2)} = \frac{1.4 \times C + 1 \times C}{1 \times C + 1.4 \times C + 1 \times C + C_{load}} \cdot V_{ini} +$$

$$\frac{1 \times C}{1 \times C + 1.4 \times C + 1 \times C + C_{load}} \cdot V_{inq} = A \cdot (2.4 \cdot V_{ini} + V_{inq})$$

The output voltage of the harmonic rejection mixer can be calculated for all eight phases in a similar manner. Table I below shows the output voltages for each of the eight phases, according to some embodiments.

TABLE I

| Phase | $V_{out}(V_{ini})$ | $V_{out}(V_{inq})$ | $V_{out} = V_{out}(V_{ini}) + V_{out}(V_{inq})$ |
| --- | --- | --- | --- |
| ① | $A \cdot V_{ini}$ | $-2.4 \cdot A \cdot V_{inq}$ | $A \cdot V_{ini} - 2.4 \cdot A \cdot V_{inq}$ |
| ② | $2.4 \cdot A \cdot V_{ini}$ | $-A \cdot V_{inq}$ | $2.4 \cdot A \cdot V_{ini} - A \cdot V_{inq}$ |
| ③ | $2.4 \cdot A \cdot V_{ini}$ | $A \cdot V_{inq}$ | $2.4 \cdot A \cdot V_{ini} + A \cdot V_{inq}$ |
| ④ | $A \cdot V_{ini}$ | $2.4 \cdot A \cdot V_{inq}$ | $A \cdot V_{ini} + 2.4 \cdot A \cdot V_{inq}$ |
| ⑤ | $-A \cdot V_{ini}$ | $2.4 \cdot A \cdot V_{inq}$ | $-A \cdot V_{ini} + 2.4 \cdot A \cdot V_{inq}$ |
| ⑥ | $-2.4 \cdot A \cdot V_{ini}$ | $A \cdot V_{inq}$ | $-2.4 \cdot A \cdot V_{ini} + A \cdot V_{inq}$ |
| ⑦ | $-2.4 \cdot A \cdot V_{ini}$ | $-A \cdot V_{inq}$ | $-2.4 \cdot A \cdot V_{ini} - A \cdot V_{inq}$ |
| ⑧ | $-A \cdot V_{ini}$ | $-2.4 \cdot A \cdot V_{inq}$ | $-A \cdot V_{ini} - 2.4 \cdot A \cdot V_{inq}$ |

Thus, in an embodiment, the output voltage of the harmonic rejection mixer may be expressed as follows:

$$V_{out} = A \cdot (Rect50\%(t) + S \cdot Rect25\%(t)) \cdot V_{ini} +$$

$$A \cdot \left(Rect50\%\left(t + \frac{T_0}{4}\right) + S \cdot Rect25\%\left(t + \frac{T_0}{4}\right)\right) \cdot V_{inq},$$

$$\text{where } A = \frac{C}{S \cdot C + C + C + C_{load}},$$

S is the is the scaling factor (e.g., $\sqrt{2}$ or 1.4), and Rect50%(t) and Rect25%(t) are rectangular waveforms having 50% and 25% duty cycles, respectively.

In an embodiment, Rect50%(t) and Rect25%(t) can be expressed as Fourier series as follows:

$$Rect50\%(t) =$$
$$\frac{A_0}{2} + \frac{A_0}{\pi}\cos(\omega_0 t) - \frac{A_0}{3\pi}\cos(3\omega_0 t) + \frac{A_0}{5\pi}\cos(5\omega_0 t) - \frac{A_0}{7\pi}\cos(7\omega_0 t) \ldots$$

$$Rect25\%(t) = \frac{A_0}{4} + \frac{A_0}{\sqrt{2}\pi}\cos(\omega_0 t) +$$
$$\frac{A_0}{3\sqrt{2}\pi}\cos(3\omega_0 t) - \frac{A_0}{5\sqrt{2}\pi}\cos(5\omega_0 t) - \frac{A_0}{7\sqrt{2}\pi}\cos(7\omega_0 t) \ldots$$

Figure 10:
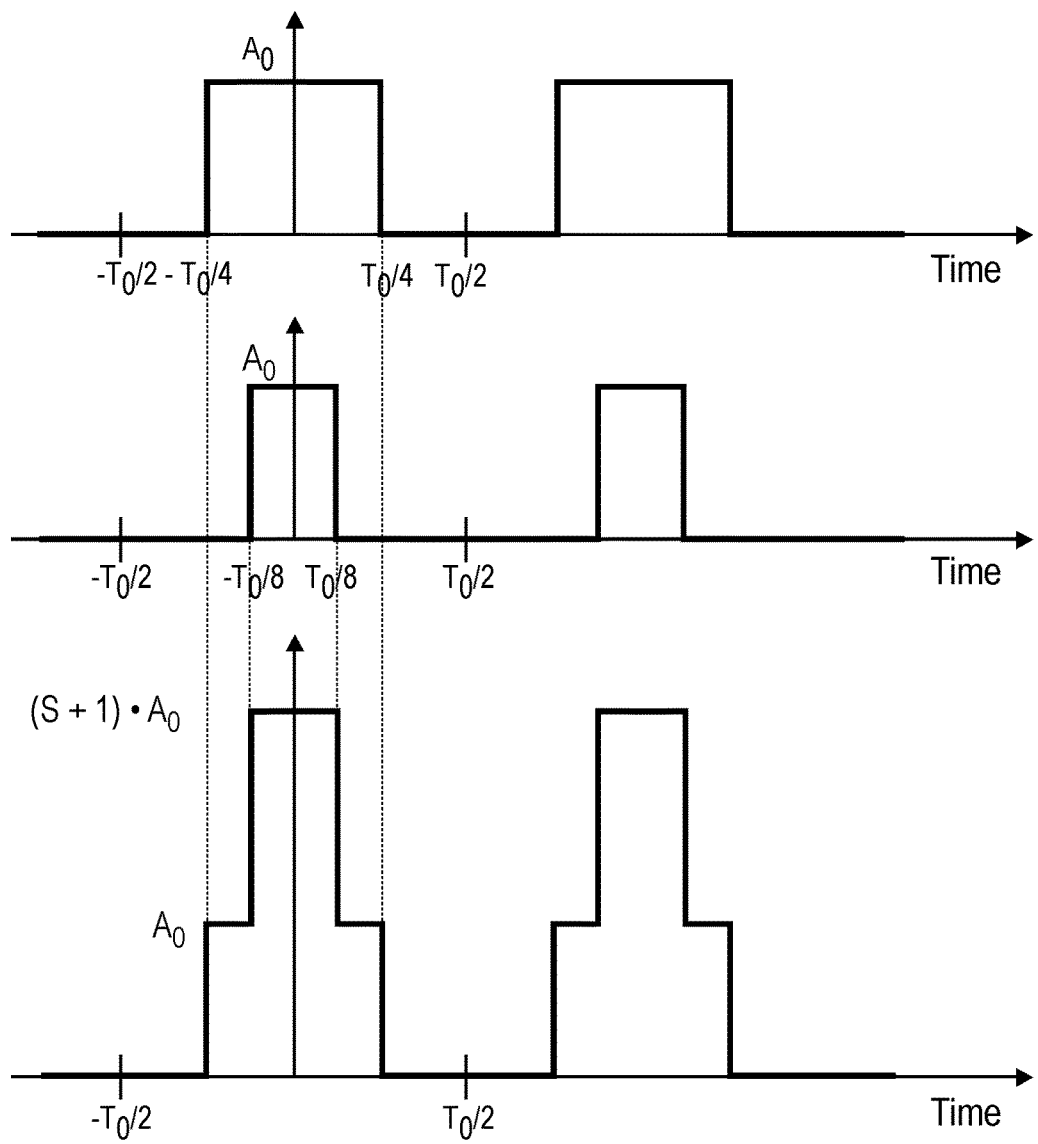
FIG. 10 is a diagram showing rectangular waveforms and the sum of the rectangular waveforms, according to some embodiments.

While the fundamental tones of Rect50%(t) and Rect25% (t) are in-phase, their third and fifth order harmonics are out-phase. As a result, the third and fifth order harmonics are cancelled out and suppressed/minimized, while the fundamental tones are constructively added if Rect50%(t) and Rect25%(t) are added with a scaling factor S (e.g., $\sqrt{2}$), as shown in the following equation and as shown in FIG. 10.

$$Rect_{50\%}(t) + \sqrt{2} \cdot Rect_{25\%}(t) = \frac{(2+\sqrt{2})A_0}{4} +$$
$$\frac{2A_0}{\pi}\cos(\omega_0 t) + 0 \cdot \cos(3\omega_0 t) + 0 \cdot \cos(5\omega_0 t) - \frac{2A_0}{7\pi}\cos(7\omega_0 t) \ldots$$

Figure 11:
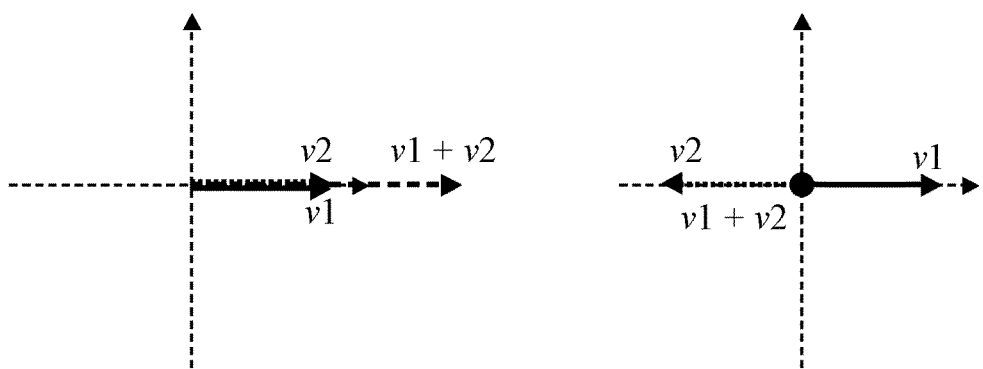
FIG. 11 is a diagram showing vector diagrams for the harmonic rejection mixer including a vector diagram of the fundamental signal and a vector diagram of the third order harmonic, according to some embodiments.

FIG. 11 is a diagram showing vector diagrams for the harmonic rejection mixer including a vector diagram of the fundamental signal and a vector diagram of the third order harmonic, according to some embodiments. In the diagram, the vectors v1 and v2 represent $\sqrt{2}$.Rect25%(t) and Rect50% (t), respectively. As shown in the diagram, the fundamental signals are constructively added (see the vector diagram on the left side of the diagram) but the third order harmonics are cancelled out (see the vector diagram on the right side of the diagram), and the mixer output does not consist of third order harmonics. The harmonic rejection mixer disclosed herein uses 2-vector modulation, where fundamental tones and third and fifth order harmonics have in-phase and out-phase, respectively, and the two vectors are realized by using switched capacitors for amplitude scaling and two different duty cycle clocks/signals to create out-of-phase harmonics. The harmonic rejection mixer may use 2-vector modulation, an 8-phase LO, and variable amplitude and duty.

Since the harmonic rejection mixer disclosed herein is based on only two vectors, the number of switch cells and clock buffers can be minimized. As a result, the power consumption of the mixer and the mixer driving circuits such as the LPF and LO signal generator, which is one of the most important requirements for low power IoT (Internet-of-Things) applications, can be minimized. Moreover, the transmitter C-IMD3 can be effectively improved without the linearization of the power amplifier or any backend blocks of the mixer, and the power consumption from the mixer backend blocks can also be minimized.

Figure 12:
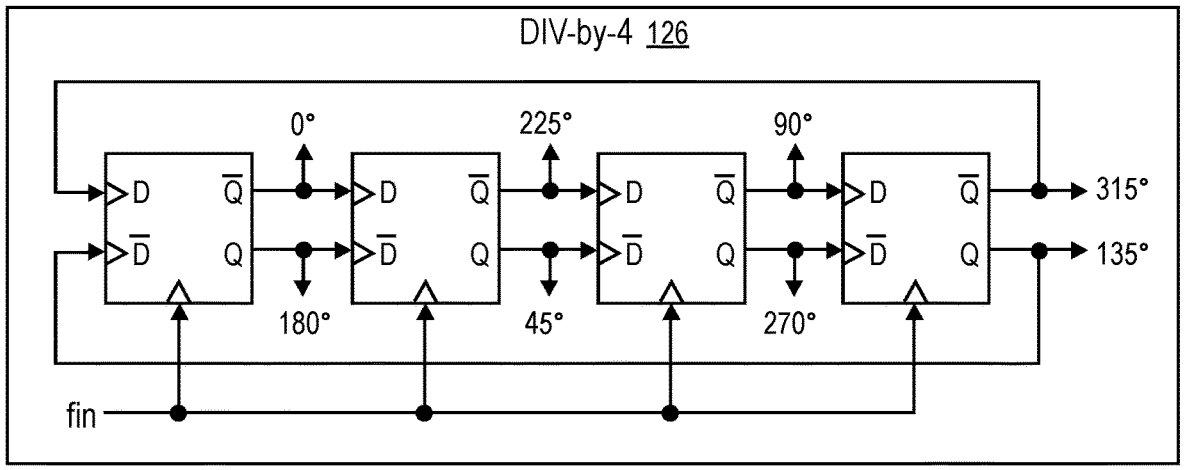
FIG. 12 is a diagram showing a div-by-4 circuit, according to some embodiments.

FIG. 12 is a diagram showing a div-by-4 circuit, according to some embodiments. As shown in the diagram, the div-by-4 circuit 126 includes a configuration of four flip flops that generate a 50% duty cycle 8-phase signal (for 0°, 45°, 90°, 135°, 180°, 225°, 270°, and 315° phases). The output of the div-by-4 circuit 126 may be provided to a 25%/50% generator circuit 128.

Figure 13:
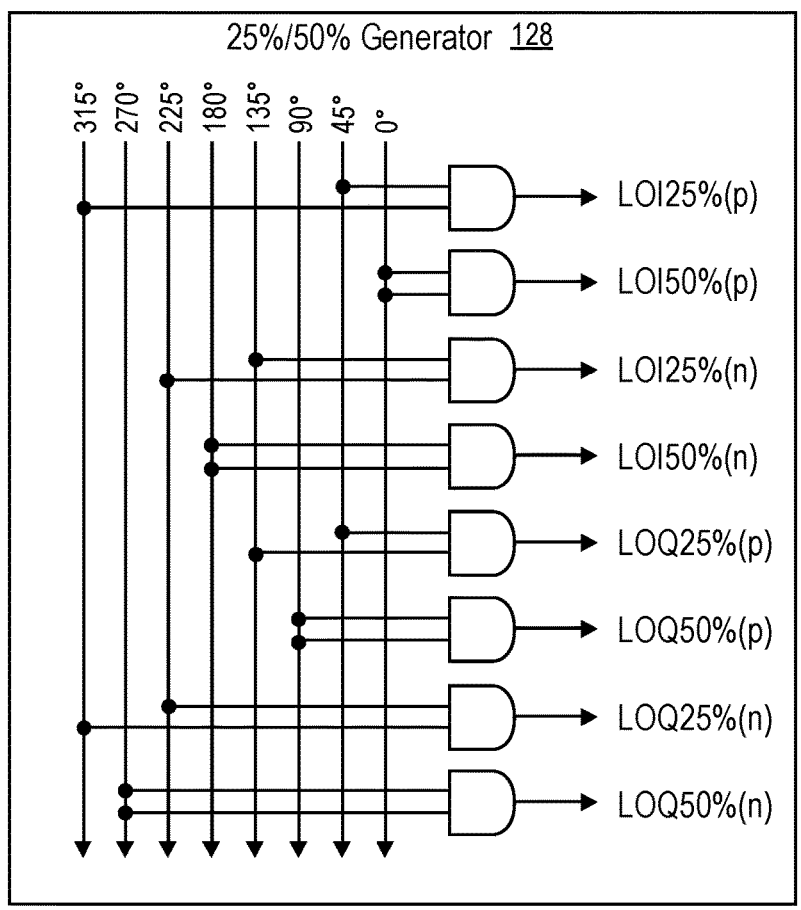
FIG. 13 is a diagram showing a 25%/50% generator circuit, according to some embodiments.

FIG. 13 is a diagram showing a 25%/50% generator circuit, according to some embodiments. The 25%/50% generator circuit 128 may receive a 50% duty cycle 8-phase signal from the div-by-4 circuit 126. As shown in the diagram, the 25%/50% generator circuit 128 includes an AND logic gate that receives the 45° and 315° signals as inputs and outputs LOI25%(p), an AND logic gate that receives the 0° signal as inputs and outputs LOI50%(p), an AND logic gate that receives the 135° and 275° signals as inputs and outputs LOI25%(n), an AND logic gate that receives the 180° signal as inputs and outputs LOI50%(n), an AND logic gate that receives the 45° and 135° signals as inputs and outputs LOQ25%(p), an AND logic gate that receives the 90° signal as inputs and outputs LOQ50%(p), an AND logic gate that receives the 275° and 315° signals as inputs and outputs LOQ25%(n), and an AND logic gate that receives the 270° signal as inputs and outputs LOQ50%(n). Thus, the 25%/50% generator circuit may generate LO signals having 25% duty cycle and LO signals having 50% duty cycle based on applying AND logic operations to various phases of the 50% duty cycle 8-phase signal. The AND logic gates used to generate the 50% duty cycle LO signals are not logically necessary, but they may help reduce/eliminate signal delay mismatch between the 25% duty cycle signals and the 50% duty cycle signals on the physical circuit.

Figure 14:
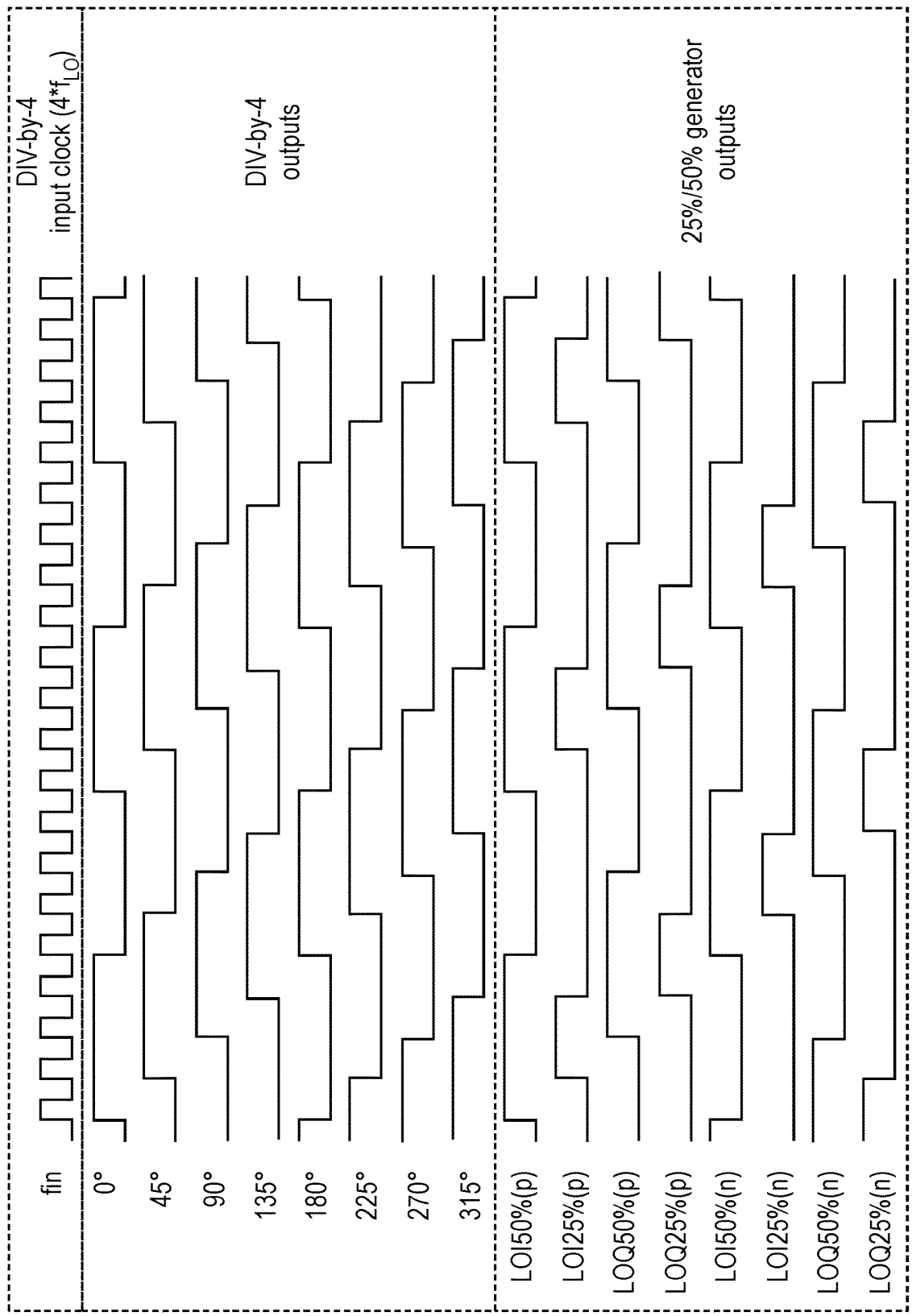
FIG. 14 is a diagram showing signals generated by the div-by-4 circuit and the 25%/50% generator circuit, according to some embodiments.

FIG. 14 is a diagram showing signals generated by the div-by-4 circuit and the 25%/50% generator circuit, according to some embodiments. In the diagram, "fin" is the input clock to the div-by-4 circuit 126. The input clock may have a frequency that is four times the frequency of the LO signals (the frequency is $4*f_{LO}$). As shown in the diagram, the output of the div-by-4 circuit 126 includes signals for 0°, 45°, 90°, 135°, 180°, 225°, 270°, and 315° phases. Also, as shown in the diagram, the output of the 25%/50% generator circuit 128 includes LOI50%(p), LOI25%(p), LOQ50%(p), LOQ25%(p), LOI50%(n), LOI25%(n), LOQ50%(n), and LOQ25%(n).

An embodiment is a RF transmitter comprising a harmonic rejection mixer. The harmonic rejection mixer may include a first switch to receive an I-path differential baseband input signal, wherein the first switch is to be controlled by a first I-path differential local oscillator (LO) signal having a 50 percent duty cycle, a second switch to receive the I-path differential baseband input signal, wherein the second switch is to be controlled by a second I-path differential LO signal having a 25 percent duty cycle, a third switch to receive a Q-path differential baseband input signal, wherein the third switch is to be controlled by a first Q-path differential LO signal having a 25 percent duty cycle, a fourth switch to receive the Q-path differential baseband input signal, wherein the fourth switch is to be controlled by a second Q-path differential LO signal having a 50 percent duty cycle, a first output capacitor coupled to the first switch, wherein the first output capacitor has a first capacitance, a second output capacitor coupled to the second switch and the third switch, wherein the second output capacitor has a second capacitance that is larger than the first capacitance by a multiple of a scaling factor, and a third output capacitor coupled to the fourth switch, wherein the third output capacitor has the first capacitance.

In an embodiment, the scaling factor is $\sqrt{2}$ or 1.4.

In an embodiment, the harmonic rejection mixer further includes a gain control capacitor to provide conversion gain control.

In an embodiment, the harmonic rejection mixer is to generate an output voltage according to the following equation:

$$V_{out} = A \cdot (Rect50\%(t) + S \cdot Rect25\%(t)) \cdot V_{ini} +$$
$$A \cdot \left(Rect50\%\left(t + \frac{T_0}{4}\right) + S \cdot Rect25\%\left(t + \frac{T_0}{4}\right)\right) \cdot V_{inq}$$

wherein $V_{out}$ is the output voltage, $V_{ini}$ is an I-path input voltage, $V_{inq}$ is a Q-path input voltage, S is the scaling factor, Rect50%(t) is a rectangular waveform with respect to time t having a 50 percent duty cycle, Rect25%(t) is a rectangular waveform with respect to time t having a 25 percent duty cycle, $T_0$ is a period of the rectangular waveforms having the 50 percent duty cycle and 25 percent duty cycle, and $$A = \frac{C}{S \cdot C + C + C + C_{load}},$$

wherein C is the first capacitance and $C_{load}$ is a capacitance of a load capacitor.

In an embodiment, one period of the first I-path differential LO signal, the second I-path differential LO signal, the first Q-path differential LO signal, and the second Q-path differential LO signal includes eight phases.

In an embodiment, the RF transmitter further comprises a LO signal generator to generate the first I-path differential LO signal, the second I-path differential LO signal, the first Q-path differential LO signal, and the second Q-path differential LO signal.

In an embodiment, the LO signal generator comprises a frequency divider circuit to generate an 8-phase signal having a 50 percent duty cycle and a twenty five and fifty percent (25/50%) generator circuit coupled to the frequency divider circuit to generate a LO signal having 25 percent duty cycle based on the 8-phase signal having 50 percent duty cycle generated by the frequency divider circuit.

In an embodiment, the 25%/50% generator circuit comprises a first AND logic circuit to perform a logical AND operation on a 45 degree phase and 315 degree phase of the 8-phase signal having the 50 percent duty cycle, a second AND logic circuit to perform a logical AND operation on a 135 degree phase and 270 degree phase of the 8-phase signal having the 50 percent duty cycle, a third AND logic circuit to perform a logical AND operation on a 45 degree phase and 135 degree phase of the 8-phase signal having the 50 percent duty cycle, a fourth AND logic circuit to perform a logical AND operation on a 225 degree phase and 315 degree phase of the 8-phase signal having the 50 percent duty cycle, a fifth AND logic circuit to perform a logical AND operation on a 0 degree phase of the 8-phase signal having the 50 percent duty cycle, a sixth AND logic circuit to perform a logical AND operation on a 90 degree phase of the 8-phase signal having the 50 percent duty cycle, a seventh AND logic circuit to perform a logical AND operation on a 180 degree phase of the 8-phase signal having the 50 percent duty cycle, and an eighth AND logic circuit to perform a logical AND operation on a 270 degree phase of the 8-phase signal having the 50 percent duty cycle.

In an embodiment, the harmonic rejection mixer is to use 2-vector modulation, wherein a first vector of the 2-vector modulation represents a waveform having a 25 percent duty cycle multiplied by the scaling factor and a second vector of the 2-vector modulation represents a waveform having a 50 percent duty cycle.

In an embodiment, the RF transmitter further comprises a power amplifier coupled to an output of the harmonic rejection mixer.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system may carry out the computer-implemented methods described herein in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A radio frequency (RF) transmitter comprising:
 a harmonic rejection mixer comprising:
  a first switch to receive an I-path differential baseband input signal, wherein the first switch is to be controlled by a first I-path differential local oscillator (LO) signal having a 50 percent duty cycle;
  a second switch to receive the I-path differential baseband input signal, wherein the second switch is to be controlled by a second I-path differential LO signal having a 25percent duty cycle;
  a third switch to receive a Q-path differential baseband input signal, wherein the third switch is to be controlled by a first Q-path differential LO signal having a 25 percent duty cycle;
  a fourth switch to receive the Q-path differential baseband input signal, wherein the fourth switch is to be controlled by a second Q-path differential LO signal having a 50 percent duty cycle;
  a first output capacitor coupled to the first switch, wherein the first output capacitor has a first capacitance;
  a second output capacitor coupled to the second switch and the third switch, wherein the second output capacitor has a second capacitance that is larger than the first capacitance by a multiple of a scaling factor; and
  a third output capacitor coupled to the fourth switch, wherein the third output capacitor has the first capacitance.

2. The RF transmitter of claim 1, wherein the scaling factor is $\sqrt{2}$ or 1.4.

3. The RF transmitter of claim 1, wherein the harmonic rejection mixer further includes a gain control capacitor to provide conversion gain control.

4. The RF transmitter of claim 1, wherein the harmonic rejection mixer is to generate an output voltage according to the following equation:

$$V_{out} = A \cdot (Rect50\%(t) + S \cdot Rect25\%(t)) \cdot V_{ini} + A \cdot \left( Rect50\%\left(t + \frac{T_0}{4}\right) + S \cdot Rect25\%\left(t + \frac{T_0}{4}\right) \right) \cdot V_{inq}$$

wherein $V_{out}$ is the output voltage, $V_{ini}$ is an I-path input voltage, $V_{inq}$ is a Q-path input voltage, S is the scaling factor, Rect50% (t) is a rectangular waveform with respect to time t having a 50 percent duty cycle, Rect25% (t) is a rectangular waveform with respect to time t having a 25 percent duty cycle, $T_0$ is a period of the rectangular waveforms having the 50 percent duty cycle and 25 percent duty cycle, and $$A = \frac{C}{S \cdot C + C + C + C_{load}},$$

wherein C is the first capacitance and $C_{load}$ is a capacitance of a load capacitor.

5. The RF transmitter of claim 1, wherein one period of the first I-path differential LO signal, the second I-path differential LO signal, the first Q-path differential LO signal, and the second Q-path differential LO signal includes eight phases.

6. The RF transmitter of claim 1, further comprising:
a LO signal generator to generate the first I-path differential LO signal, the second I-path differential LO signal, the first Q-path differential LO signal, and the second Q-path differential LO signal.

7. The RF transmitter of claim 6, wherein the LO signal generator comprises:
a frequency divider circuit to generate an 8-phase signal having a 50 percent duty cycle; and
a twenty five and fifty percent (25/50%) generator circuit coupled to the frequency divider circuit to generate a LO signal having 25 percent duty cycle based on the 8-phase signal having 50 percent duty cycle generated by the frequency divider circuit.

8. The RF transmitter of claim 7, wherein the 25%/50% generator circuit comprises:
a first AND logic circuit to perform a logical AND operation on a 45 degree phase and 315 degree phase of the 8-phase signal having the 50 percent duty cycle;
a second AND logic circuit to perform a logical AND operation on a 135 degree phase and 270 degree phase of the 8-phase signal having the 50 percent duty cycle;
a third AND logic circuit to perform a logical AND operation on a 45 degree phase and 135 degree phase of the 8-phase signal having the 50 percent duty cycle;
a fourth AND logic circuit to perform a logical AND operation on a 225 degree phase and 315 degree phase of the 8-phase signal having the 50 percent duty cycle;
a fifth AND logic circuit to perform a logical AND operation on a 0 degree phase of the 8-phase signal having the 50 percent duty cycle;
a sixth AND logic circuit to perform a logical AND operation on a 90 degree phase of the 8-phase signal having the 50 percent duty cycle;
a seventh AND logic circuit to perform a logical AND operation on a 180 degree phase of the 8-phase signal having the 50 percent duty cycle; and
an eighth AND logic circuit to perform a logical AND operation on a 270 degree phase of the 8-phase signal having the 50 percent duty cycle.

9. The RF transmitter of claim 1, wherein the harmonic rejection mixer is to use 2-vector modulation, wherein a first vector of the 2-vector modulation represents a waveform having a 25 percent duty cycle multiplied by the scaling factor and a second vector of the 2-vector modulation represents a waveform having a 50 percent duty cycle.

10. The RF transmitter of claim 1, further comprising: a power amplifier coupled to an output of the harmonic rejection mixer.

11. A harmonic rejection mixer comprising:
a first switch to receive an I-path differential baseband input signal, wherein the first switch is to be controlled by a first I-path differential local oscillator (LO) signal having a 50 percent duty cycle;
a second switch to receive the I-path differential baseband input signal, wherein the second switch is to be controlled by a second I-path differential LO signal having a 25 percent duty cycle;
a third switch to receive a Q-path differential baseband input signal, wherein the third switch is to be controlled by a first Q-path differential LO signal having a 25 percent duty cycle;
a fourth switch to receive the Q-path differential baseband input signal, wherein the fourth switch is to be controlled by a second Q-path differential LO signal having a 50 percent duty cycle;
a first output capacitor coupled to the first switch, wherein the first output capacitor has a first capacitance;
a second output capacitor coupled to the second switch and the third switch, wherein the second output capacitor has a second capacitance that is larger than the first capacitance by a multiple of a scaling factor; and
a third output capacitor coupled to the fourth switch, wherein the third output capacitor has the first capacitance.

12. The harmonic rejection mixer of claim 11, wherein the scaling factor is √2 or 1.4.

13. The harmonic rejection mixer of claim 11, further comprising:
a gain control capacitor to provide conversion gain control.

14. The harmonic rejection mixer of claim 11, wherein an output voltage is to generated according to the following equation:

$$V_{out} = A \cdot (Rect50\%(t) + S \cdot Rect25\%(t)) \cdot V_{ini} + A \cdot \left(Rect50\%\left(t + \frac{T_0}{4}\right) + S \cdot Rect25\%\left(t + \frac{T_0}{4}\right)\right) \cdot V_{inq}$$

wherein $V_{out}$ is the output voltage, $V_{ini}$ is an I-path input voltage, $V_{inq}$ is a Q-path input voltage, S is the scaling factor, Rect50% (t) is a rectangular waveform with respect to time t having a 50 percent duty cycle, Rect25% (t) is a rectangular waveform with respect to time t having a 25 percent duty cycle, $T_0$ is a period of the rectangular waveforms having the 50 percent duty cycle and 25 percent duty cycle, and $$A = \frac{C}{S \cdot C + C + C + C_{load}},$$

wherein C is the first capacitance and $C_{load}$ is a capacitance of a load capacitor.

15. The harmonic rejection mixer of claim 11, wherein one period of the first I-path path differential LO signal, the second I-path differential LO signal, the first Q-path differential LO signal, and the second Q-path differential LO signal includes eight phases.

* * * * *